United States Patent
Koh

(10) Patent No.: US 11,084,190 B2
(45) Date of Patent: Aug. 10, 2021

(54) FOREIGN MATERIAL CLEANING SYSTEM FOR COMPRESSION MOLDING

(71) Applicant: Micron Technology, Inc., Boise, ID (US)

(72) Inventor: Kean Tat Koh, Singapore (SG)

(73) Assignee: Micron Technology, Inc., Boise, ID (US)

( * ) Notice: Subject to any disclaimer, the term of this patent is extended or adjusted under 35 U.S.C. 154(b) by 207 days.

(21) Appl. No.: 16/234,300

(22) Filed: Dec. 27, 2018

(65) Prior Publication Data
US 2020/0206982 A1   Jul. 2, 2020

(51) Int. Cl.
*B29C 33/72* (2006.01)
*B08B 7/00* (2006.01)
*B29C 43/32* (2006.01)
*B29L 31/34* (2006.01)

(52) U.S. Cl.
CPC .......... *B29C 33/72* (2013.01); *B08B 7/0028* (2013.01); *B29C 43/32* (2013.01); *B29L 2031/34* (2013.01)

(58) Field of Classification Search
CPC combination set(s) only.
See application file for complete search history.

(56) References Cited

U.S. PATENT DOCUMENTS 6,537,406 B1 *  3/2003  Jensen, Jr. ............ B65B 51/067
                                                  156/202
9,111,966 B2 *  8/2015  Kitagawa .......... H01L 21/67028

FOREIGN PATENT DOCUMENTS

JP         11-19946    *  1/1999  ............. B29C 33/72

OTHER PUBLICATIONS

Machine translation of JP11-19946; Jan. 1999.*

* cited by examiner

*Primary Examiner* — Erin F Bergner
(74) *Attorney, Agent, or Firm* — Perkins Coie LLP

(57) ABSTRACT

The present technology relates to systems and methods for cleaning a compression molding system. In particular, a system including a first roller carrying a cleaning tape is provided. The system further includes a second roller configured to dispense the cleaning tape along a compression molding structure. The tape is removably adhered to the structure and subsequently removed, thereby removing foreign debris such as dust and/or other particles from the compression molding structure.

19 Claims, 9 Drawing Sheets

FOREIGN MATERIAL CLEANING SYSTEM FOR COMPRESSION MOLDING

TECHNICAL FIELD

The present technology relates to systems and methods for cleaning a compression molding system.

BACKGROUND

Many packaged microelectronic devices have a substrate, a microelectronic die attached to the substrate, an interconnection between the die and the substrate (e.g., a wire) and a protective covering or encapsulant encasing the die and its interconnection. The protective covering is generally a plastic or epoxy compound that can be molded to form a casing over the die and its interconnection. The microelectronic die can be a memory device, a microprocessor, or another type of microelectronic assembly having integrated circuitry. Several types of packaged devices also include bond pads on the substrate that are coupled to the integrated circuitry of the die. The bond pads may alternatively be coupled to pins or other types of terminals that are exposed on the exterior of the microelectronic device for connecting the die to buses, circuits, and/or other microelectronic assemblies.

A significant limiting process when manufacturing packaged microelectronic devices is encapsulating the die with the protective covering. The dies and interconnections are sensitive components that should be protected from physical contact and potentially harmful environmental conditions to avoid damaging the die and its interconnection. The protective casing encapsulating the die and interconnection, therefore, should seal the die and interconnection from the external environment and shield the die and interconnection from electrical and mechanical shocks. Thus, the protective casing should not have any voids that may allow contaminants or other harmful agents to contact and potentially damage the die and interconnection.

One conventional technique for encapsulating dies and interconnections is compression molding. During a compression molding process, the substrate and die are loaded onto an upper block of the compression molding system and a mold compound is loaded onto a lower block of the compression molding system. The lower block moves upwardly toward the upper block, such that that the die and interconnection are immersed within the mold compound. Once the die and interconnection are fully encapsulated, the upper block separates from the lower block and the encapsulated die is removed.

However, foreign debris such as dust or other particles may accumulate on one or more surfaces of the compression molding system. Such accumulation may affect the viability of the compression molding process. For example, foreign material may cause indentation to the substrate and/or die crack failure during the molding process.

Conventional methods of cleaning compression molding structures have many shortcomings. For example, one conventional cleaning method uses a vacuum cleaning system comprising a vacuum tubing and a brush. However, such vacuum cleaning systems may introduce dust and/or particles into the compression molding system via the brush and/or may otherwise damage the compression molding structure. Another method is to use a hardened sheet to manually scratch along a surface of the compression molding system. However, this method may damage the compression molding structure through physical deformation and does not capture the dust and/or other particles removed from the surface. Accordingly, a need exists for improved systems and methods for cleaning compression molding systems.

DETAILED DESCRIPTION

Specific details of several embodiments of systems, methods, and devices for cleaning a compression molding system are described herein.

Figure 1A:
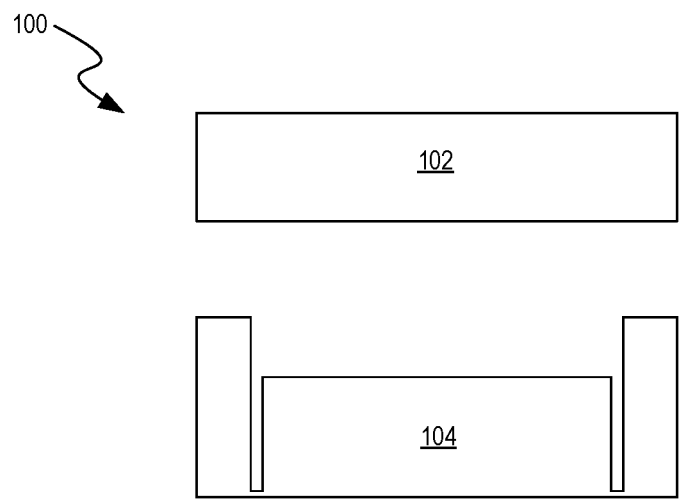
FIGS. 1A-1G are partially schematic, cross-sectional side views of a compression molding apparatus for encapsulating microelectronic devices using a mold process.
Figure 1B:
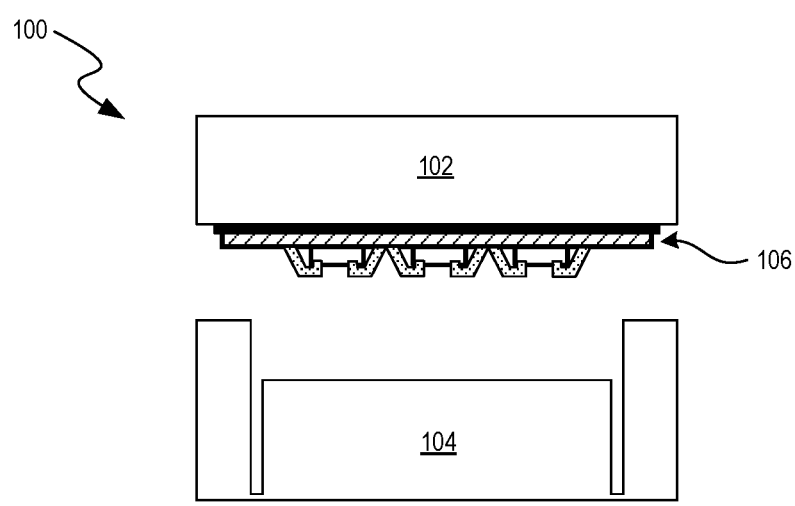
Figure 1C:
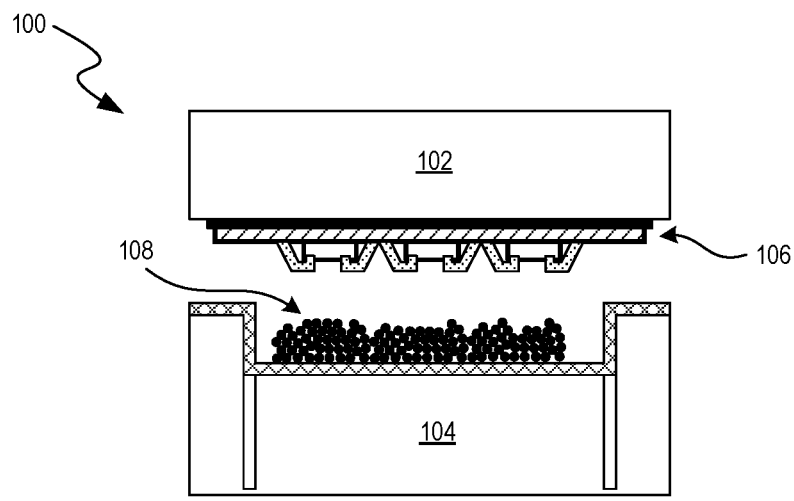
Figure 1D:
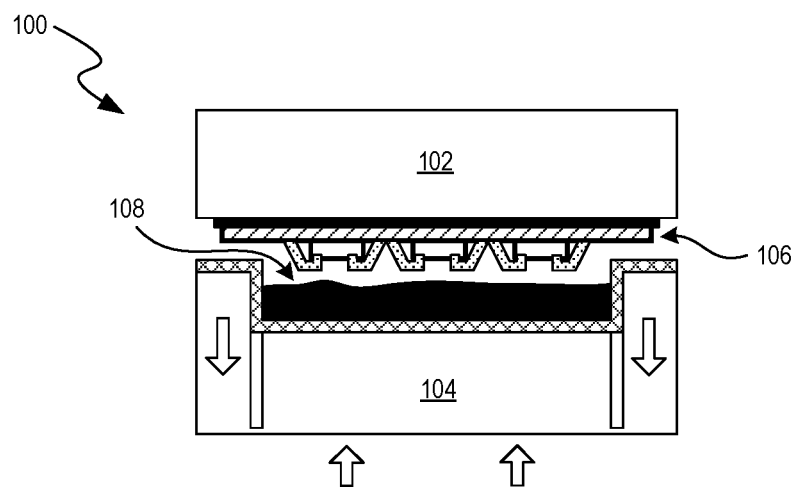
Figure 1E:
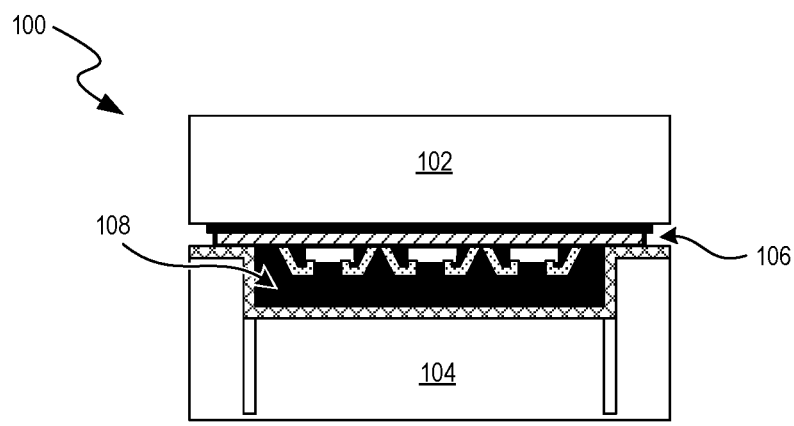
Figure 1F:
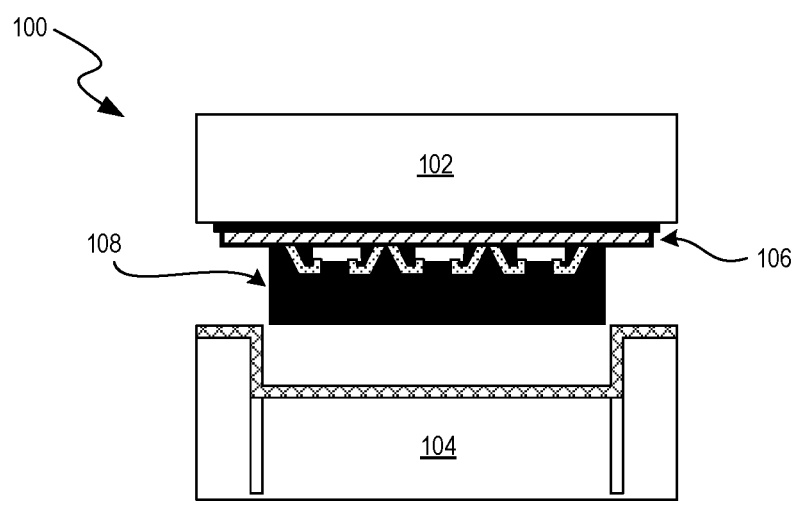

FIGS. 1A-1G illustrate a compression molding system for encapsulating semiconductor dies. FIG. 1A illustrates a compression molding system 100 that includes a top chase block 102 and a bottom cavity 104. In FIG. 1B, a strip 106 including a substrate and a semiconductor die has been loaded into the compression molding system 100, such that the strip 106 is in apposition with a surface of the top chase block 102. As shown in FIG. 1C, a mold compound may then be loaded into the compression molding system 100 such that it occupies a space adjacent to the bottom cavity 104. Once the mold compound 108 has been added to the compression molding system 100, the mold compound 108 may be heated and the top chase block 102 and/or bottom cavity 104 may move towards each other, as illustrated in FIG. 1D. As further shown in FIG. 1E, the space between the top chase block 102 and the bottom cavity 104 may be reduced until the strip 106 is immersed in the heated mold compound 108. Finally, as shown in FIG. 1F, the top chase block 102 or the bottom cavity 104 may move away from each other and the strip 106 encapsulated by the mold compound 108 may be removed from the compression molding system 100.

Figure 1G:
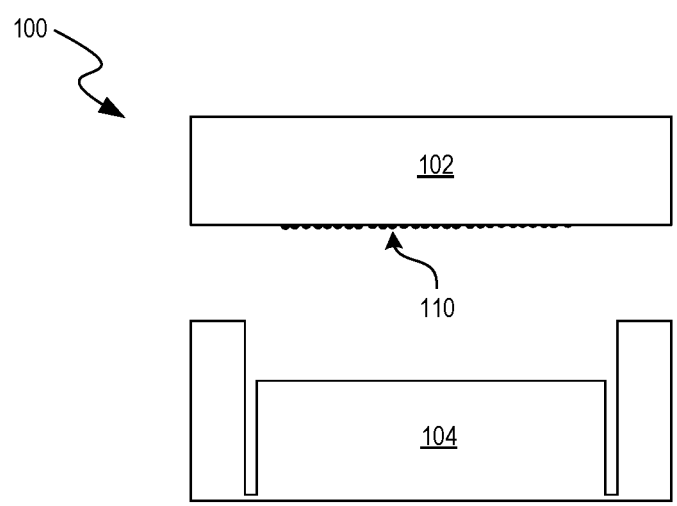

However, foreign debris such as dust and/or other particles may accumulate on one or more surfaces of the compression molding system. FIG. 1G illustrates one possibility, with a foreign debris 110 gathering on the surface of the top chase block 102. As recognized in the art, build-up of foreign debris on the top chase block may cause indentation to the substrate and possibly die crack failure during the compression molding cycle.

FIGS. 2A-2E illustrate one embodiment of a cleaning system 200 and a process for cleaning a surface 207 of a compression molding structure 202. As will be discussed in further detail herein, the cleaning system 200 includes a loading roller 204 configured to carry and dispense a cleaning tape 214. The cleaning system 200 further includes an unloading roller 206 configured to attach to an end region of the cleaning tape 214. The unloading roller 206 is configured to move from a first position adjacent to a first end portion 203 of the compression molding structure 202 to a second position adjacent to a second end portion 205 of the compression molding structure 202. By moving from the first position to the second position, the unloading roller 206 dispenses the cleaning tape 214 along a surface 207 of the compression molding structure 202. In some embodiments, the system 200 may also include an attachment roller 208, a vacuum support tube 210, a support roller 212, a first gauge 216, and a second gauge 218.

The cleaning tape 214 may have a first surface and a second surface. In some embodiments, the first surface may be a sticky surface and the second surface may be a non-sticky surface. In such embodiments, the sticky surface is capable of removably adhering to another surface, such as a surface 207 of the compression molding structure 202. In other embodiments, the first surface and the second surface may be sticky. The cleaning tape 214 may be any tape suitable for cleaning a compression molding system. One non-limiting example of a suitable tape is a high temperature tape, such as 3M Polyimide Film Tape 5413.

Figure 2A:
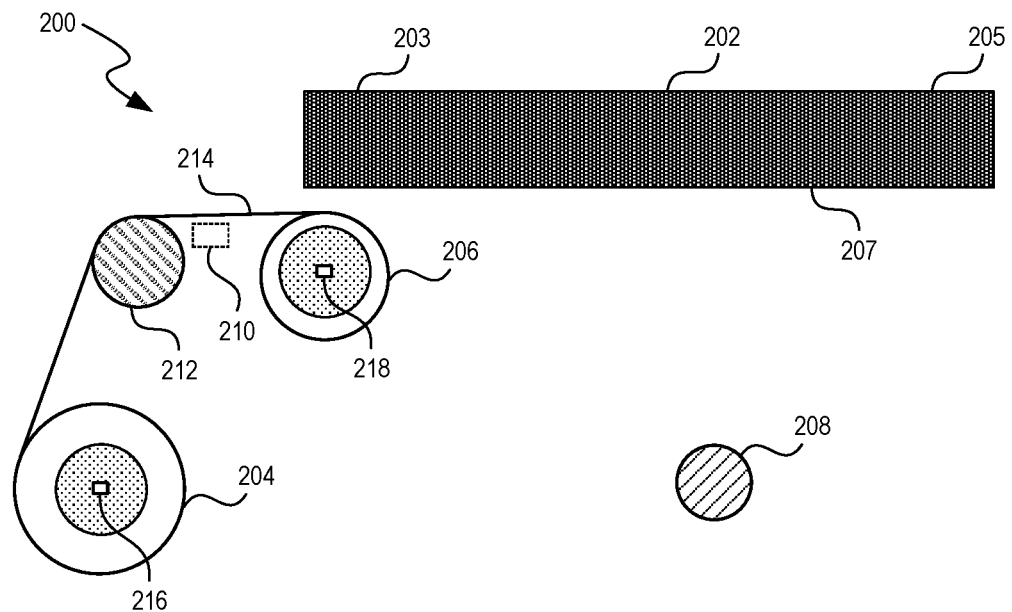
FIGS. 2A-2E are cross-sectional side views of a cleaning system in accordance with one embodiment of the present technology.

FIG. 2A illustrates the cleaning system 200 during a first stage of one embodiment of the cleaning process. In some embodiments, the configuration of the cleaning system 200 in FIG. 2A is a starting position for the cleaning system. As illustrated in FIG. 2A, the loading roller 204 and the unloading roller 206 may both be positioned adjacent a first end portion 203 of the compression molding structure 202. A first end region of the cleaning tape 214 may be attached to the unloading roller 206 such that the cleaning tape 214 extends between the loading roller 204 and the unloading roller 206. A support roller 212 may optionally be positioned between the loading roller 204 and the unloading roller 206, such that the cleaning tape 214 extending between the loading roller 204 and the unloading roller touches the support roller 212. The support roller 212, as shown in FIG. 2A, may direct the cleaning tape 214 dispensed from the loading roller 204 toward the first end portion 203 of the compression molding structure 202. In some embodiments, however, the support roller 212 is not included and the loading roller 204 and unloading roller 206 are configured such that tape dispensed from the loading roller 204 is directed towards the first end portion 203 of the compression molding structure 202.

As further illustrated by FIG. 2A, the attachment roller 208 may be positioned spaced apart from the loading roller 204 and the compression molding structure 202. As will be discussed in greater detail below, the attachment roller 208 may be configured to apply pressure on at least a segment of cleaning tape 214 dispensed between the first end portion 203 and the second end portion 205 of the compression molding structure 202. By applying pressure on the cleaning tape 214, the attachment roller 208 causes a sticky side of the cleaning tape 214 to removably adhere to a surface 207 of the compression molding structure 202.

As further illustrated by FIG. 2A, the vacuum support tube 210 may be positioned between the unloading roller 206 and the support roller 212. In embodiments without the support roller 212, the vacuum support tube 210 may be positioned between the loading roller 204 and the unloading roller 206. In either embodiment, the vacuum support tube 210 may be adjacent to the cleaning tape 214 and is configured to releasably secure a region of the dispensed cleaning tape 214 through a suction force.

As also illustrated by FIG. 2A, the system may include one or more gauges 216 and 218 (e.g., sensors). These gauges may be configured to monitor the cleaning process. If something in the process goes wrong (e.g., a roller malfunctions, the tape tears, etc.), the gauges can terminate the cleaning process to prevent damage to the compression molding structure. For example, in the embodiments depicted in FIG. 2A-2E, the loading roller may include a first tension gauge 216 configured to detect an abnormality during operation of the system, and the unloading roller may include a second tension gauge 218 configured to detect an abnormality during operation of the system. In other embodiments, a sensor or gauge may be positioned at some other place in the system.

Figure 2B:
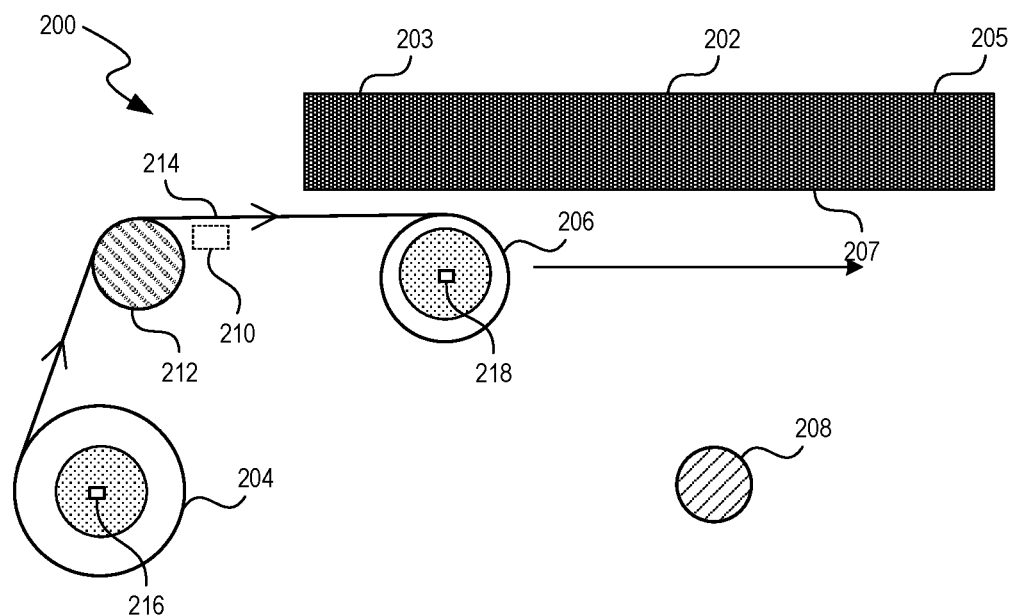

FIG. 2B illustrates the system 200 during a second stage of one embodiment of the cleaning process. In FIG. 2B, the unloading roller 206 moves in a first direction from a first position adjacent a first end portion 203 of the compression molding structure 202 towards a second position adjacent a second end portion 205 of the compression molding structure 202. In some embodiments, the unloading roller 206 does not rotate when moving in the first direction. Thus, because the unloading roller 206 is attached to the first end region of the cleaning tape 214, the unloading roller 206 unwinds a segment of the cleaning tape 214 from the loading roller 204 as it moves toward the second position, thereby increasing the length of the cleaning tape 214 dispensed from the loading roller 204. In other embodiments, a portion of the unloading roller 206 may rotate as it moves in the first direction. However, the portion of the unloading roller 206 attached to the cleaning tape 214 does not rotate, thereby unwinding a segment of the cleaning tape 214 from the loading roller 204 as it moves toward the second position. In yet other embodiments where the unloading roller 206 rotates as it moves in the first direction, the unloading roller may carry a cleaning tape 214 and dispense the cleaning tape 214 as it moves from the first position to the second position.

Figure 2C:
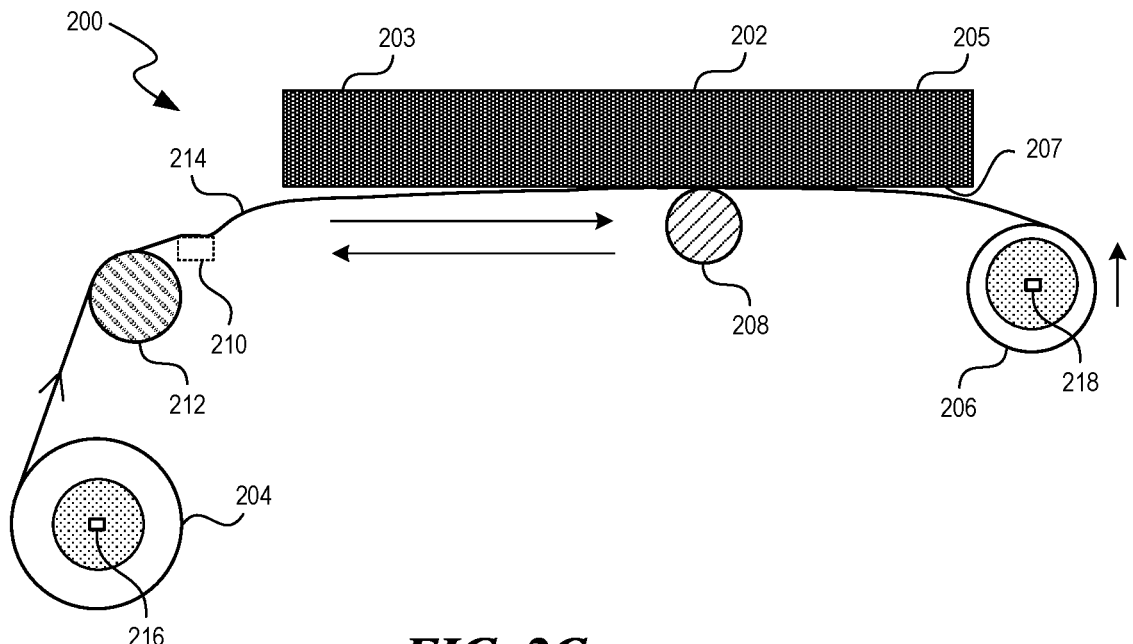

FIG. 2C illustrates the system 200 during a third stage of one embodiment of the cleaning process. In FIG. 2C, the unloading roller 206 has reached the second position adjacent the second end portion 205 of the compression molding structure 202. In some embodiments, the unloading roller 206 may optionally move to a third position that is closer to the compression molding structure 202. By moving to a third position, the unloading roller 206 forces the dispensed segment of cleaning tape 214 extending between the unloading roller 206 and the loading roller 204 into closer proximity with the compression molding structure 202. In other embodiments, the unloading roller 206 does not move to the third position, and the second position is sufficiently close to the compression molding structure 202 to place the dispensed segment of cleaning tape 214 extending between the unloading roller 206 and the loading roller 204 in close proximity with the compression molding structure 202. When the unloading roller 206 is in either its second or third position, the loading roller 204 may be tensioned to prevent the cleaning tape 214 from being further dispensed.

In some embodiments, a vacuum support tube 210 may releasably secure a first region of the cleaning tape 214 adjacent the first end portion 203 once the unloading roller 206 has reached its second or third position. To do this, the vacuum support tube 210 may apply a suction or other force suitable to secure the first region of cleaning tape 214. Alternatively, the first region of the cleaning tape 214 may be releasably secured by another structure, such as the support roller 212 or the loading roller 204. Furthermore, the unloading roller 206, once in its second or third position, may also releasably secure a second region (e.g., the end region) of the cleaning tape 214. Releasably securing a first region of the cleaning tape 214 adjacent the first end portion 203 and a second region of the cleaning tape 214 adjacent the second end portion 205 helps hold the tape in position near the surface 207.

Once a segment of the cleaning tape 214 spans from the first end portion 203 of the compression molding structure 202 to the second end portion 205 of the compression molding structure 202, the segment of cleaning tape 214 is removably adhered to the surface 207. In some embodiments, the attachment roller 208 removably adheres the cleaning tape 214 to the surface 207. For example, the attachment roller 208 may move towards segment of cleaning tape 214 and the compression molding structure 202 and apply pressure on the cleaning tape 214 such that a sticky surface of the cleaning tape 214 presses against a surface 207 of the compression molding structure 202, thereby causing the cleaning tape 214 to removably adhere to the surface 207. The attachment roller 208 may further move or roll along the surface 207 of the compression molding structure 202 to cause a larger segment of the cleaning tape 214 positioned between it and the compression molding structure 202 to removably adhere to the surface 207. For example, the attachment roller may move from a first position adjacent the second end portion 205 of the compression molding structure 202 to a second position adjacent the first end portion 203 of the compression molding structure 202. In some embodiments, the attachment roller may move back and forth between the first position and the second position to ensure the cleaning tape 214 is smoothly and/or suitably adhered to the surface 207.

In some embodiments, however, the system 200 does not include an attachment roller. In such embodiments, the cleaning tape is adhered to the surface 207 through another mechanism. For example, the cleaning tape may be removably adhered to the surface 207 while the unloading roller is moving from its first position adjacent the first end portion 203 to its second position adjacent the second end portion 205. In other embodiments, once in its second position, the unloading roller and the loading roller may each move towards the compression molding structure 202, thereby pressing the segment of cleaning tape 214 extending between them against the surface 207.

Figure 2D:
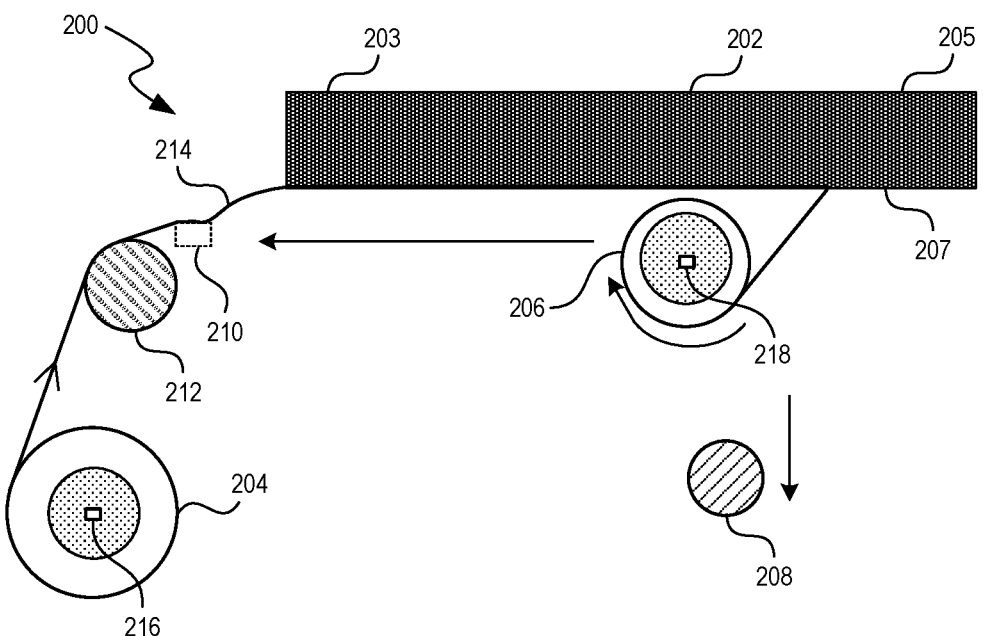

FIG. 2D illustrates the system 200 during a fourth stage of one embodiment of the cleaning process. In FIG. 2D, the attachment roller 208 has moved back towards its original position spaced apart from the compression molding structure 202. The unloading roller 206 then moves from its second or third position back towards its first position. For example, the unloading roller 206 moves from the second end portion 205 towards the first end portion 203. While moving towards the first end portion 203, the unloading roller removes the cleaning tape 214 removably adhered to the surface 207. The unloading roller 206 may remove the cleaning tape 214 by rotating as it moves towards the first end portion 203, thereby pulling the cleaning tape from the surface 207 and winding the removed segment of the cleaning tape 214 around the rotating unloading roller 206. In other embodiments, the unloading roller 206 may move towards the first end portion 203 without rotation, but will still remove the cleaning tape 214 adhered to the surface 207.

Figure 2E:
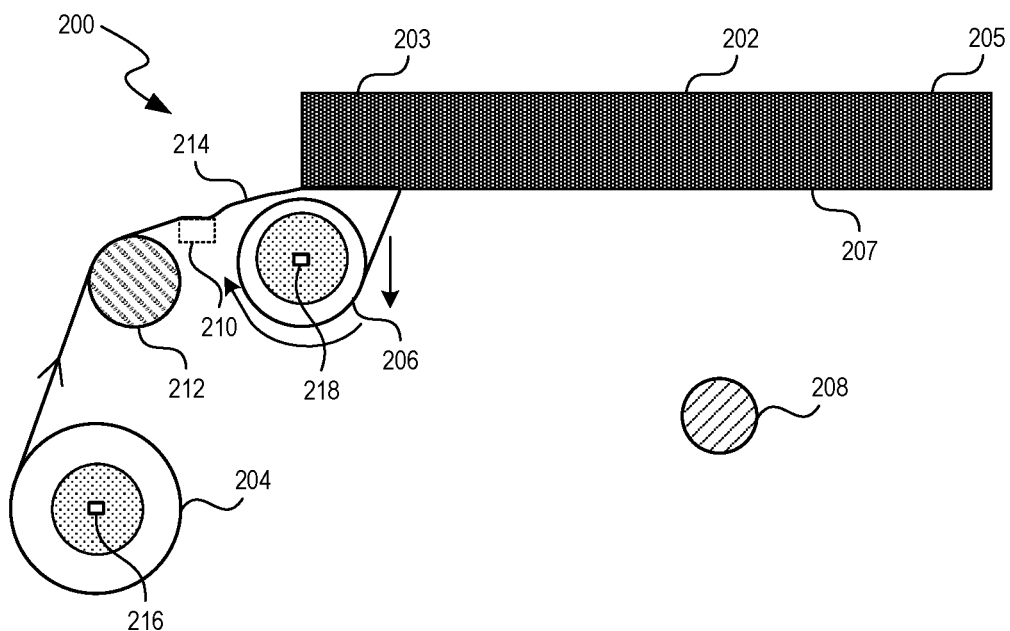

FIG. 2E illustrates the system 200 during a fifth stage of one embodiment of the cleaning process. In FIG. 2E, the unloading roller 206 has returned to a fourth position at or near its first position adjacent to the first end portion 203 of the compression molding structure 202. As a result, the cleaning tape 214 has been removed from the surface 207 and wound around the unloading roller 206. If present, the vacuum support tube 210 may then release its suction on the cleaning tape 214, thereby returning the system 200 to a configuration substantially similar to its starting position illustrated in FIG. 2A.

The process of adhering and subsequently removing the cleaning tape from the surface of the compression molding structure as described herein may remove foreign debris such as dust and other particles from the surface. Accordingly, performing the cleaning process outlined in FIGS. 2A-2E with the system 200 before loading a strip including a substrate and a semiconductor die into the compression molding system may prevent and/or reduce the likelihood of indentation to the substrate and die crack failure during the compression molding cycle.

In some embodiments, the system 200 is capable of repeating the cleaning process outlined in FIGS. 2A-2E without need for user interference or assistance. For example, the system 200 may be capable of repeating the cleaning process one, two, three, four, five, or more times before requiring user interference or assistance. In some embodiments, the limiting factor on the number of times the cleaning process may be repeated without user interference is the amount of cleaning tape the loading roller and/or unloading roller may carry. For example, if the loading roller 204 runs out of cleaning tape 214, a user may replace the fully dispensed roll of cleaning tape with a new roll of unused cleaning tape. The user may also remove the previously dispensed cleaning tape wound around the unloading roller 206. Further, in some embodiments, the system 200 and the cleaning process may be automated, such that user assistance is not required to clean the compression molding structure 202.

Figure 3:
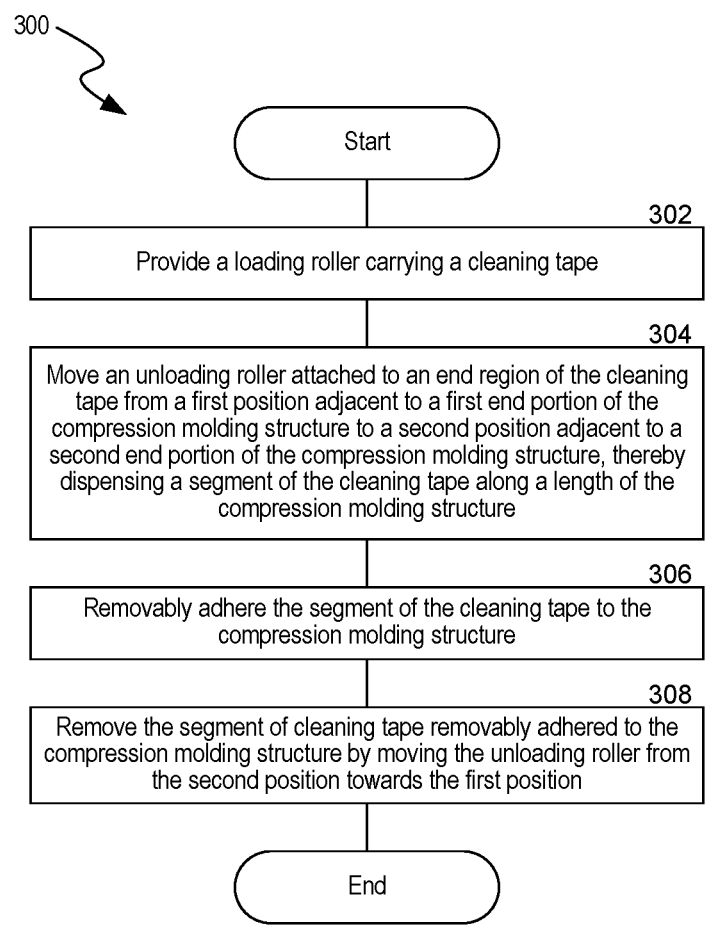
FIG. 3 is a flow diagram of a method of cleaning a compression molding structure in accordance with one embodiment of the present technology.

FIG. 3 is a flow chart of a method 300 for cleaning a compression molding structure in accordance with selected embodiments of the present technology. The method 300 can include providing a loading roller carrying a cleaning tape (process portion 302). As noted previously, the cleaning tape may be any tape suitable for use in a compression molding system environment. For example, the cleaning tape may be a high temperature tape (e.g., 3M Polyimide Film Tape 5413). The method 300 further includes moving an unloading roller attached to an end region of the cleaning tape from a first position adjacent to a first end portion of the compression molding structure to a second position adjacent to a second end portion of the compression molding structure. This movement dispenses a segment of the cleaning tape along a length of the compression molding structure (process portion 304).

The method 300 continues by removably adhering the segment of the cleaning tape dispensed along a length of the compression molding structure to the compression molding structure (process portion 306). As discussed previously, this may be done through a variety of mechanisms. For example, an attachment roller may removably adhere the cleaning tape to the compression molding structure by pressing the cleaning tape against the structure along a length of the compression molding structure. Additionally or alternatively, the unloading roller may removably adhere the cleaning tape to the compression molding structure while it is moving from the first position to the second position. In yet another example, the cleaning tape may be removably adhered to compression molding structure by securing an end region of the cleaning tape to the unloading roller at the second end portion of the compression molding system and by securing a first region of the cleaning tape adjacent to the first end portion of the compression molding structure. The two secured regions of the cleaning tape can be moved towards the compression molding structure until the segment of tape between the secured regions is in apposition with the compression molding structure.

After removably adhering the cleaning tape to the compression molding structure, the method 300 continues by removing the segment of cleaning tape removably adhered to the compression molding structure by moving the unloading roller from the second position towards the first position (process portion 308). As previously noted, the unloading roller may remove the cleaning tape by rotating as it moves towards the first position, thereby pulling the cleaning tape from the compression molding structure and winding the removed segment of the cleaning tape around the rotating unloading roller. In other embodiments, however, the unloading roller may move towards the first position without rotation, but will still remove the cleaning tape adhered to the compression molding structure.

Figure 4:
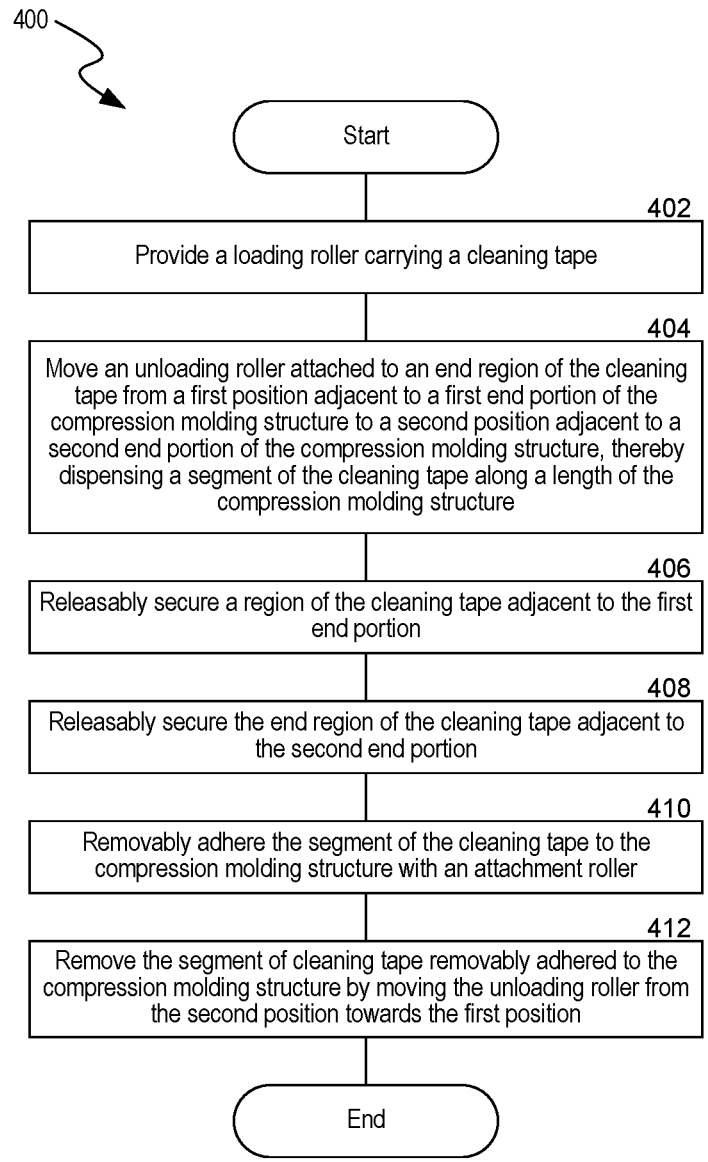
FIG. 4 is a flow diagram of a method of cleaning a compression molding structure in accordance with another embodiment of the present technology.

FIG. 4 is a flow chart of a method 400 for cleaning a compression molding structure in accordance with selected embodiments of the present technology. The method 400 may begin by providing a loading roller carrying a cleaning tape (process portion 402). The method 400 further includes moving an unloading roller attached to an end region of the cleaning tape from a first position adjacent to a first end portion of the compression molding structure to a second position adjacent to a second end portion of the compression molding structure. This movement dispenses a segment of the cleaning tape along a length of the compression molding structure (process portion 404).

The method 400 continues by releasably securing a region of the cleaning tape adjacent to the first end portion of the compression molding structure (process portion 406). This region of the cleaning tape may be secured by, for example, a vacuum support tube. Additionally or alternatively, this region may be releasably secured by another structure, such as a support or the loading roller. The method 400 further includes releasably securing the end region of the cleaning tape adjacent to the second end portion of the compression molding structure (process portion 408). For example, the end region may be releasably secured by the unloading roller.

The method 400 continues by removably adhering the segment of the cleaning tape to the compression molding structure with an attachment roller (process portion 410). As discussed previously, the attachment roller may apply pressure on the cleaning tape such that a sticky surface of the cleaning tape presses against the compression molding structure, thereby causing the cleaning tape to removably adhere to the compression molding structure. The attachment roller may also move or roll along the compression molding structure to cause a larger segment of the cleaning tape positioned between it and the compression molding structure to removably adhere to the structure. For example, the attachment roller may move from a first position adjacent the second end portion of the compression molding system to a second position adjacent the first end portion of the compression molding system. In some embodiments, the attachment roller may move back and forth between the first position and the second position to ensure the cleaning tape is smoothly and/or suitably adhered to the surface.

After removably adhering the cleaning tape to the compression molding structure, the method 400 continues by removing the segment of cleaning tape removably adhered to the compression molding structure by moving the unloading roller from the second position towards the first position (process portion 412). As previously noted, the unloading roller may remove the cleaning tape by rotating as it moves towards the first position, thereby pulling the cleaning tape from the compression molding structure and winding the removed segment of the cleaning tape around the rotating unloading roller. In other embodiments, however, the unloading roller may move towards the first position without rotation, but will still remove the cleaning tape adhered to the compression molding structure.

As used herein and as can be appreciated from the foregoing discussion, the term "roller" refers to any device capable of performing the described function and does not limit the device to a conventional tape roller. In general, the rollers described herein will be capable of either linear translation, rotational translation, or both linear and rotational translation. However, in some embodiments, the roller may be fully stationary.

For example, the loading roller may be any device capable of carrying and dispensing a cleaning tape in accordance with the present technology. For example, in some embodiments, the loading roller may be configured to rotate around a central axis while remaining in a stationary position. In other examples, the loading roller may be capable of both rotational and linear translation.

Furthermore, the unloading roller may be any device capable of moving from a first position adjacent to a first end portion of the compression molding structure to a second position adjacent to a second end portion of the compression molding structure in accordance with the present technology. The unloading roller may be capable of both rotational and linear translation. For example, in some embodiments, the unloading roller may be configured to move from a first position to a second position (i.e., linear translation) without rotation, and from a second position to a third position (i.e., linear translation) while rotating around a central axis (i.e., rotational translation). In some embodiments, one portion of the unloading roller may rotate while moving from the first position to the second position, while a second portion attached to the cleaning tape does not rotate. This ensures the cleaning tape will be dispensed along the length of the compression molding structure. However, when removing the cleaning tape from the compression molding structure, the unloading roller will rotate such that the removed cleaning tape is wound around the unloading roller.

Furthermore, as can be appreciated by one of skill in the art from the disclosure, the present technology may be capable of cleaning more than one surface of the compression molding system. For example, the present technology may be used to clean the top chase block of the compression molding system. It may also be used, however, to clean the bottom cavity and/or another other surface of the compression molding system.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a,", "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of items in the list. Additionally, the term "comprising" is used throughout to mean including at least the recited feature(s) such that any greater number of the same feature and/or additional types of other features are not precluded. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

I claim:

1. A system for cleaning a compression molding structure, the system comprising:
   a loading roller configured to carry and dispense a cleaning tape;
   an unloading roller configured to attach to a first region of the cleaning tape and to move in a first direction from a first position adjacent to a first end portion of the compression molding structure to a second position adjacent to a second end portion of the compression molding structure, wherein moving from the first position to the second position dispenses the cleaning tape between the first end portion and the second end portion;
   a vacuum support tube configured to releasably secure a second region of the dispensed cleaning tape adjacent to the first end portion; and
   an attachment roller configured to apply pressure to at least a segment of the dispensed cleaning tape to removably adhere the segment to the compression molding structure.

2. The system of claim 1, wherein the unloading roller is further configured to move from the second position to a third position closer to the compression molding structure and releasably secure the first region of the cleaning tape in a second fixed position.

3. The system of claim 2, wherein, when the unloading roller is in the third position, the loading roller is tensioned to prevent the cleaning tape from being further dispensed.

4. The system of claim 1, wherein the attachment roller is configured to removably adhere at least the segment of the dispensed cleaning tape to the compression molding structure by pressing a sticky surface of the dispensed cleaning tape against at least a portion of the compression molding structure.

5. The system of claim 1, wherein the unloading roller is further configured to move in a second direction, and wherein moving in the second direction removes the dispensed cleaning tape removably adhered to the compression molding structure.

6. The system of claim 5, wherein, when moving in the second direction, the unloading roller is configured to rotate such that at least a portion of the dispensed cleaning tape is wound around the unloading roller.

7. The system of claim 5, wherein removing the dispensed cleaning tape from the compression molding structure removes debris attached to the compression molding structure.

8. The system of claim 5, wherein the unloading roller is further configured to return to the first position and the vacuum support tube is further configured to release the releasably secured second region of the cleaning tape.

9. The system of claim 1, wherein the loading roller has a first tension gauge and the unloading roller has a second tension gauge, and wherein the first and second tension gauges are configured to detect an abnormality during operation of the system.

10. The system of claim 1, further comprising a support roller configured to position the dispensed cleaning tape adjacent to the first end portion.

11. A method for cleaning a compression molding structure, the method comprising:
   providing a loading roller carrying a cleaning tape;
      moving an unloading roller attached to a first region of the cleaning tape from a first position adjacent to a first end portion of the compression molding structure to a second position adjacent to a second end portion of the compression molding structure, wherein moving the unloading roller from the first position to the second position dispenses a segment of the cleaning tape along a length of the compression molding structure;
   releasably securing a second region of the dispensed cleaning tape adjacent to the first end portion using a vacuum support tube;
   removably adhering the segment of the cleaning tape to the compression molding structure by applying pressure to the segment with an attachment roller; and
   removing the segment of cleaning tape removably adhered to the compression molding structure by moving the unloading roller from the second position towards the first position.

12. The method of claim 11, wherein the segment of the cleaning tape is removably adhered to the compression molding structure by the unloading roller as the unloading roller moves from the first position to the second position.

13. The method of claim 11, wherein the attachment roller moves along a first surface of the segment of the cleaning tape such that the attachment roller presses a second sticky surface of the cleaning tape against the compression molding structure.

14. The method of claim 11, wherein moving the unloading roller from the second position towards the first position comprises rotating the unloading roller such that at least a portion of the segment of cleaning tape removed from the compression molding system is wound around the unloading roller.

15. A method for cleaning a compression molding structure, the method comprising:
   providing a loading roller carrying a cleaning tape;
   moving an unloading roller attached to a first region of the cleaning tape from a first position adjacent to a first end portion of the compression molding structure to a second position adjacent to a second end portion of the compression molding structure, wherein moving the unloading roller from the first position to the second position places a segment of the cleaning tape along a length of the compression molding structure;

releasably securing a second region of the cleaning tape adjacent to the first end portion using a vacuum support tube;

releasably securing the first region of the cleaning tape adjacent to the second end portion;

removably adhering the segment of the cleaning tape to the compression molding structure by applying pressure to the segment with an attachment roller; and removing the segment of the cleaning tape removably adhered to the compression molding structure by moving the unloading roller from the second position towards the first position.

16. The method of claim 15, wherein the first region of the cleaning tape is releasably secured adjacent to the second end portion of the compression molding structure by the unloading roller.

17. The method of claim 16, further comprising releasing the second region of the cleaning tape releasably secured by the vacuum support tube.

18. The method of claim 15, wherein the attachment roller removably adheres the segment of the cleaning tape to the compression molding structure by pressing a sticky surface of the cleaning tape against the compression molding structure.

19. The method of claim 15, wherein removing the segment of cleaning tape removably adhered to the compression molding structure removes foreign debris attached to the compression molding structure.

* * * * *